United States Patent
Uematsu et al.

(10) Patent No.: US 7,129,525 B2
(45) Date of Patent: Oct. 31, 2006

(54) SEMICONDUCTOR LIGHT-EMITTING DEVICE

(75) Inventors: Koji Uematsu, Itami (JP); Masaki Ueno, Itami (JP); Ryu Hirota, Itami (JP); Hideaki Nakahata, Itami (JP); Manabu Okui, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/908,116

(22) Filed: Apr. 28, 2005

(65) Prior Publication Data

US 2005/0242357 A1   Nov. 3, 2005

(30) Foreign Application Priority Data

Apr. 30, 2004   (JP)   ............... 2004-136265
Feb. 1, 2005   (JP)   ............... 2005-025433

(51) Int. Cl.
*H01L 33/00* (2006.01)

(52) U.S. Cl. ............... 257/94; 257/96; 257/101; 257/102; 257/103

(58) Field of Classification Search ............... 257/94, 257/96, 101–103

See application file for complete search history.

(56) References Cited

U.S. PATENT DOCUMENTS 6,639,925 B1 * 10/2003 Niwa et al. ............... 372/45.01

FOREIGN PATENT DOCUMENTS

JP   2002-076025 A   3/2002
JP   2002-326895 A   11/2002

* cited by examiner

*Primary Examiner*—Thien F. Tran
(74) *Attorney, Agent, or Firm*—James W. Judge

(57) ABSTRACT

Affords semiconductor light-emitting devices in which generation of spontaneous electric fields in the active layer is reduced to enable enhanced brightness. Semiconductor light-emitting device (1) is furnished with an n-type cladding layer (3), a p-type cladding layer (7) provided over the n-type cladding layer (3), and an active layer (5) composed of a nitride and provided in between the n-type cladding layer (3) and the p-type cladding layer (7), and therein is characterized in that the angle formed by an axis orthogonal to the interface between the n-type cladding layer (3) and the active layer (5), and the c-axis in the active layer (5), and the angle formed by an axis orthogonal to the interface between the active layer (5) and the p-type cladding layer (7), and the c-axis in the active layer (5), are each greater than zero.

25 Claims, 6 Drawing Sheets

| | Residual electron density (cm$^{-3}$) when undoped | Residual $p$-type carrier density (cm$^{-3}$) when nitrogen-doped |
|---|---|---|
| MgZnO crystal grown onto a {0001} plane | $5 \times 10^{16}$ | Unmeasurable |
| MgZnO crystal grown onto a {10$\bar{1}$0} plane | $8 \times 10^{14}$ | $5 \times 10^{17}$ |
| MgZnO crystal grown onto a {11$\bar{2}$4} plane | $2 \times 10^{15}$ | $3 \times 10^{17}$ |

FIG. 6

SEMICONDUCTOR LIGHT-EMITTING DEVICE

BACKGROUND OF THE INVENTION

1. Field of the Invention

The present invention relates to semiconductor light-emitting devices.

2. Background Art

The development in recent years of relatively short-wavelength semiconductor light-emitting devices, including blue light-emitting diodes (LEDs) and ultraviolet LEDs, has been flourishing. Group III-V compounds such as InGaN and AlGaN as well as Group II-VI compounds such as ZnO, materials of comparatively large band gap, are ideally suited for use in such semiconductor light-emitting devices. In one example of a semiconductor light-emitting device of this sort, an active layer containing InGaN is arranged in between an n-type cladding layer containing AlGaN, and a p-type cladding layer likewise containing AlGaN. In another example, an active layer containing ZnO is arranged in between an n-type cladding layer containing MgZnO, and a p-type cladding layer likewise containing MgZnO.

Crystals composed of a III-V compound like InGaN, or a II-VI compound like ZnO in many cases constitute hexagonal structures. In semiconductor light-emitting devices having active layers composed of such hexagonal-system crystalline compounds, the generation of spontaneous electric fields, such as piezoelectric fields, at the active layer heterointerfaces is known to occur. The larger such spontaneous electric fields are, the narrower the overlapping portions of the wave functions of the electrons and holes in the active layer become, lowering the probability that the electrons and holes will recombine. The light-emitting efficiency of such devices consequently deteriorates to the extent that spontaneous electric fields grow larger. Inasmuch as spontaneous electric fields become more extensive the thicker is an active layer, the thickness of active layers (especially well layers in quantum-well structures) is restricted for the sake of curbing degradation in light-emitting efficiency due to spontaneous electric fields. This limitation on the thickness of active layers is one factor impeding the enhancement of semiconductor light-emitting device brightness.

SUMMARY OF THE INVENTION

An object of the present invention, having been brought in consideration of the foregoing issues, is to make available semiconductor light-emitting devices in which generation of spontaneous electric fields in the active layer is reduced to enable enhanced brightness.

In order to resolve the problems discussed above, a semiconductor light-emitting device according to the present invention is furnished with: a semiconductor layer of a first conductivity type, composed of a hexagonal compound; a semiconductor layer of a second conductivity type, composed of a hexagonal compound and provided over the first-conductivity-type semiconductor layer; and an active layer, composed of a hexagonal compound and provided in between the first-conductivity-type semiconductor layer and the second-conductivity-type semiconductor layer. The semiconductor light-emitting device is therein characterized in that the angles that an axis orthogonal to the active-layer interface on its first-conductivity-type semiconductor layer side, and an axis orthogonal to the active-layer interface on its second-conductivity-type semiconductor layer side respectively form with the c-axis in the active layer are greater than zero.

A semiconductor light-emitting device according to another aspect of the present invention is furnished with: a nitride semiconductor layer of a first conductivity type; a nitride semiconductor layer of a second conductivity type, provided over the first-conductivity-type nitride semiconductor layer; and an active layer provided in between the first-conductivity-type nitride semiconductor layer and the second-conductivity-type nitride semiconductor layer, and composed of a nitride. The semiconductor light-emitting device is therein characterized in that the angles that an axis orthogonal to the active-layer interface along the first-conductivity-type nitride semiconductor layer, and an axis orthogonal to the active-layer interface along the second-conductivity-type nitride semiconductor layer respectively form with the c-axis in the active layer are greater than zero.

In an implementation in which the active layer is composed of a hexagonal compound such as a nitride semiconductor, spontaneous electric fields that occur in the active layer will be largest when the axes orthogonal to the two boundary surfaces flanking the active layer coincide with the c-axis in the active layer (that is, when the active layer grows on the c-plane). In either of the semiconductor light-emitting devices described above, the fact that the angles that an axis orthogonal to the active-layer interface along the first-conductivity-type semiconductor layer (or the first-conductivity-type nitride semiconductor layer), and an axis orthogonal to the active-layer interface along the second-conductivity-type semiconductor layer (or the second-conductivity-type nitride semiconductor layer) respectively form with the c-axis in the active layer are greater than zero (that is, the fact that the two boundary surfaces flanking the active layer are not c-planes), contributes to reducing the generation of spontaneous electric fields in the active layer. Since thus reducing spontaneous electric fields broadens the overlapping portions of the wave functions of the electrons and holes in the active layer, raising the likelihood that the electrons and holes will recombine, the active layer may be made thicker, which enables the brightness of the light-emitting device to be enhanced to a greater degree.

A semiconductor light-emitting device according to a further aspect of the invention is furnished with: a substrate composed of a hexagonal compound and having a principal face; a semiconductor layer of a first conductivity type, composed of a hexagonal compound and grown epitaxially onto the principal face of the substrate; an active layer grown epitaxially onto the first-conductivity-type semiconductor layer and composed of a hexagonal compound; and a semiconductor layer of a second conductivity type, composed of a hexagonal compound and grown epitaxially onto the active layer. The semiconductor light-emitting device is therein characterized in that the angle that an axis orthogonal to the principal face of the substrate forms with the c-axis of the substrate is greater than zero.

In accordance with a still further aspect of the invention a semiconductor light-emitting device is furnished with: a substrate composed of a Group III nitride and having a principal face; a nitride semiconductor layer of a first conductivity type, grown epitaxially onto the principal face of the nitride substrate; an active layer grown epitaxially onto the first-conductivity-type nitride semiconductor layer, and composed of a nitride; and a nitride semiconductor layer of a second conductivity type, grown epitaxially onto the active layer. The semiconductor light-emitting device is therein characterized in that the angle that an axis orthogonal to the principal face of the nitride substrate forms with the c-axis of the nitride substrate is greater than zero.

In either of the semiconductor light-emitting devices described above, the fact that the angle that an axis orthogonal to the principal face of the substrate (or the nitride substrate) forms with the c-axis of the substrate (or the nitride substrate) is greater than zero (that is, the fact that the principal face of the substrate (or the nitride substrate) is not a c-plane) means that the two boundary surfaces of the active layer grown epitaxially onto the principal face are not c-planes, therefore making it possible to reduce the generation of spontaneous electric fields in the active layer. Thus reducing spontaneous electric fields allows the active layer may be made thicker, which enables the brightness of the light-emitting device to be enhanced to a greater degree.

The foregoing semiconductor light-emitting devices may also be characterized in that the principal face of the substrate (or the nitride substrate) contains any one plane among the {10$\bar{1}$0} planes, {11$\bar{2}$4} planes, and {11$\bar{2}$0} planes of the substrate (or the nitride substrate). In that this will mean that the two boundary surfaces of the active layer contain any one plane among these planes, the generation of spontaneous electric fields in the active layer can be reduced effectively. It will be appreciated that {10$\bar{1}$0} planes, {11$\bar{2}$4} planes, and {11$\bar{2}$0} planes as used herein signify families of equivalent planes. For example, the (10$\bar{1}$0) plane, the (01$\bar{1}$0) plane, the ($\bar{1}$100) plane, the ($\bar{1}$010) plane, the (0$\bar{1}$10) plane, and the (1$\bar{1}$00) plane would be included in the {10$\bar{1}$0} family of planes.

The foregoing semiconductor light-emitting devices may be characterized in being further furnished with a first electrode, provided on the reverse face of the substrate (or nitride substrate) and in ohmic contact with the substrate (or nitride substrate), and a second electrode, provided on the second-conductivity-type semiconductor layer (or the second-conductivity-type nitride semiconductor layer) and in ohmic contact with the second-conductivity-type semiconductor layer (or the second-conductivity-type nitride semiconductor layer). Providing electrodes on the two faces of the semiconductor light-emitting device in this way makes for very efficient injecting of electrons and holes into the active layer, thus contributing to brightness-enhancing the semiconductor light-emitting device further.

Semiconductor light-emitting devices in aspects of the present invention set forth above may also be characterized in that the hexagonal compounds of the first-conductivity-type semiconductor layer, the second-conductivity-type semiconductor layer, and the active layer include Group II atoms and Group VI atoms. The fact that, inasmuch as crystals of II-VI compounds containing Group II atoms and Group VI atoms will constitute hexagonal crystalline structures, the angles that an axis orthogonal to the active-layer interface along the first-conductivity-type semiconductor layer, and an axis orthogonal to the active-layer interface along the second-conductivity-type semiconductor layer respectively form with the c-axis in the active layer will be greater than zero, contributes to efficiently reducing the generation of spontaneous electric fields in the active layer. Semiconductor light-emitting devices in these implementations may be characterized in that the Group II atoms are zinc atoms, or characterized in that the hexagonal compounds are ZnO-based compounds.

Alternatively, semiconductor light-emitting devices in certain aspects of the invention may be characterized in that the hexagonal compounds of the first-conductivity-type semiconductor layer, the second-conductivity-type semiconductor layer, and the active layer include Group III atoms and Group V atoms. The fact that, inasmuch as crystals of III-V compounds containing Group III atoms and Group V atoms will constitute hexagonal crystalline structures, the angles that an axis orthogonal to the active-layer interface along the first-conductivity-type semiconductor layer, and an axis orthogonal to the active-layer interface along the second-conductivity-type semiconductor layer respectively form with the c-axis in the active layer will be greater than zero, contributes to efficiently reducing the generation of spontaneous electric fields in the active layer. Semiconductor light-emitting devices in these implementations may be characterized in that the Group V atoms are nitrogen atoms, or characterized in that the hexagonal compounds are GaN-based compounds.

Furthermore, semiconductor light-emitting devices in relevant aspects of the present invention may be characterized in that dislocation density in the principal face of the nitride substrate is $1 \times 10^8$ cm$^{-2}$ or less. By thus furnishing the semiconductor light-emitting devices with a nitride substrate in which the dislocation density in the principal face is comparatively small, the density of dislocations that, penetrating the first-conductivity-type nitride semiconductor layer, reach the active layer can be held low to further heighten the light-emitting efficiency of the devices.

In addition, semiconductor light-emitting devices of the present invention may be characterized in that the active layer has a quantum-well structure that includes a well layer and, flanking the well layer, barrier layers that set up a potential barrier in the well layer, with the thickness of the well layer being greater than 3 nm. On account of the occurrence of spontaneous electric fields as discussed earlier, the well-layer thickness in a quantum-well structure has traditionally been restricted to being no greater than 3 nm. In contrast, the fact that incidents of spontaneous electric fields in the well layer can be reduced by means of the foregoing semiconductor light-emitting devices enables the well layer to be made thicker than what has conventionally been the case.

Semiconductor light-emitting devices of the present invention may further be characterized in that the well layer is composed of $Al_xIn_yGa_{(1-x-y)}N$ ($0 \leq x \leq 1$, $0 < y \leq 1$). In conventional devices in which the well layer thus includes indium (In) in their composition, the larger the atomic fraction of In, the more pronounced will be the occurrences of spontaneous electric fields. In contrast, the fact that incidents of spontaneous electric fields in the well layer can be reduced by means of the semiconductor light-emitting devices in each of the foregoing aspects of the present invention enables enhanced brightness even in semiconductor light-emitting devices furnished with a well layer composed of $Al_xIn_yGa_{(1-x-y)}N$ ($0 \leq x \leq 1$, $0 < y \leq 1$).

By means of semiconductor light-emitting devices according to the present invention, outbreaks of spontaneous electric fields in the active layer are minimized to enable enhanced brightness.

From the following detailed description in conjunction with the accompanying drawings, the foregoing and other objects, features, aspects and advantages of the present invention will become readily apparent to those skilled in the art.

BRIEF DESCRIPTION OF THE SEVERAL VIEWS OF DRAWINGS

FIG. 2 is isometric views illustrating a substrate in this embodiment, wherein

Figure 5A:
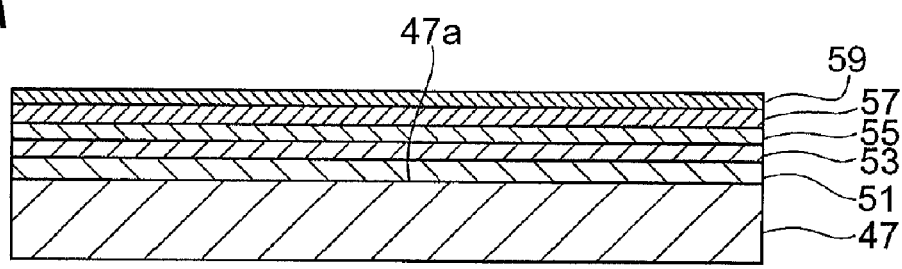
Figure 5B:
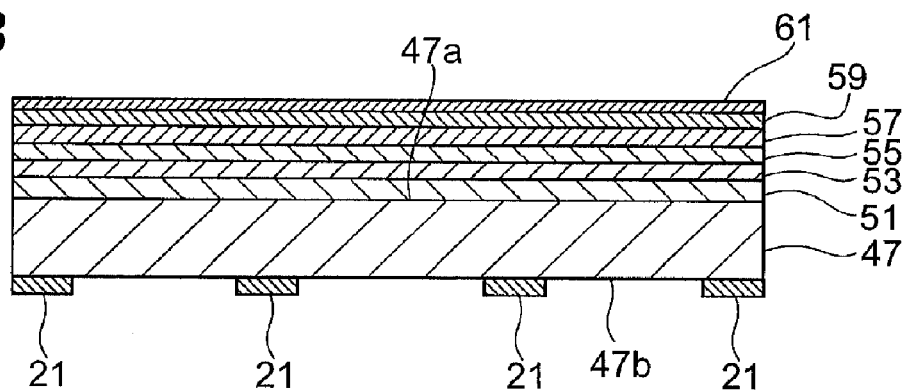
Figure 5C:
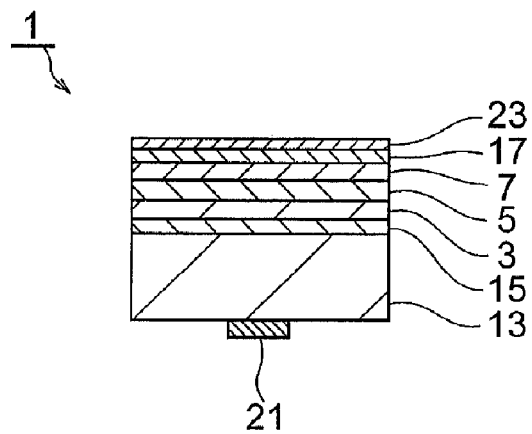

FIGS. 5A–5C are sectional views for explaining a method utilizing the substrate to manufacture the semiconductor light-emitting device; and FIG. 6 is a chart setting forth residual electron densities within MgZnO not having been doped, and p-type carrier concentration within MgZnO having been nitrogen-doped, in cases in which MgZnO crystal has been grown onto a $\{0001\}$ plane, onto a $\{10\overline{1}0\}$ plane, and onto a $\{11\overline{2}4\}$ plane, respectively.

DETAILED DESCRIPTION OF THE INVENTION

While referring to the accompanying drawings, a detailed explanation of embodiments of semiconductor light-emitting devices according to the present invention will be made in the following. It should be understood that in discussing the drawings, with identical reference marks being attached to identical elements, redundant description of such elements will be omitted.

Figure 1:
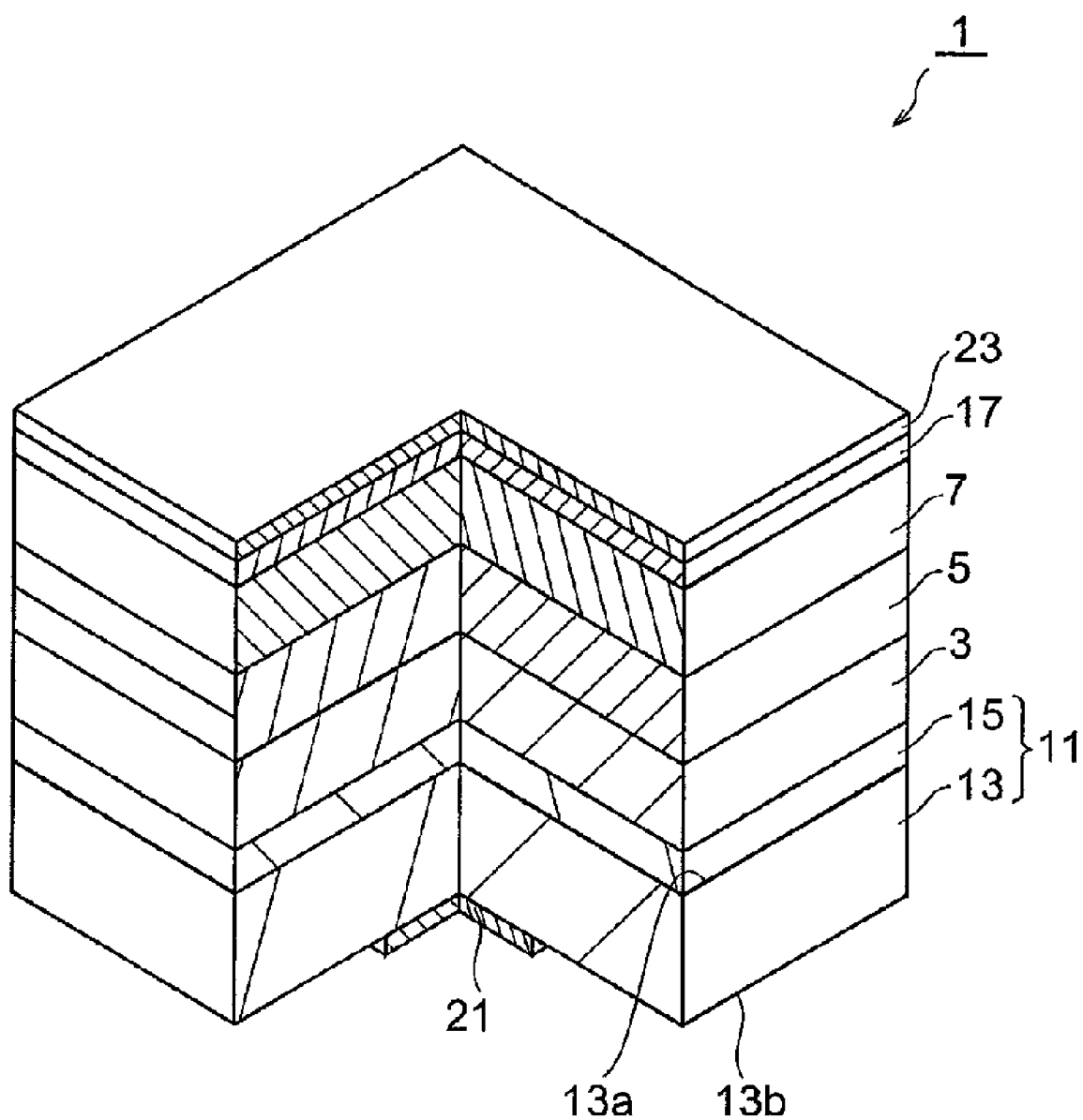
FIG. 1 is a drawing illustrating a semiconductor light-emitting device involving an embodiment of the present invention.

FIG. 1 is a drawing representing a semiconductor light-emitting device involving an embodiment of the present invention. The semiconductor light-emitting device illustrated in FIG. 1 is an optimal structure for a planar-emitting optical element such as a light-emitting diode.

As will be seen in FIG. 1, the semiconductor light-emitting device 1 is furnished with a support base 11, an n-type cladding layer 3, an active layer 5, a p-type cladding layer 7, a p-type contact layer 17, a cathode 21, and an anode 23.

The support base 11 is constituted to include a substrate 13, and an n-type buffer layer 15 grown epitaxially onto the principal face 13a of the substrate 13. With the n-type buffer layer 15 intervening, the n-type cladding layer 3, active layer 5, p-type cladding layer 7, and p-type contact layer 17 are laminated in order onto the principal face 13a of the substrate 13. The substrate 13 is constituted to include a hexagonal compound such as a III-V compound containing Group III atoms and Group V atoms, or a II-VI compound containing Group II atoms and Group VI atoms. As specific examples, a nitride substrate composed of a Group III nitride (e.g., a gallium-nitride (GaN) based compound or an aluminum-nitride (AlN) based compound) containing nitrogen atoms (N) as Group V atoms, or a substrate composed of a compound (e.g., a zinc-oxide (ZnO) based compound) containing zinc atoms (Z) as Group II atoms can be utilized as the substrate 13.

The substrate 13 is lent a rectangular plate form in which for example, its thickness is 300 μm, and its planar dimensions are 10 mm×10 mm. Another characteristic of the substrate 13 is that it has n-type conductivity from the addition of an n-type dopant such as silicon (Si) for example. An optimal concentration of n-type dopant in the substrate 13 is for example from $1\times10^{17}$ cm$^{-3}$ to $1\times10^{19}$ cm$^{-3}$. Further, so that light generated in the active layer 5 will pass optimally through the substrate 13, the absorption coefficient of the substrate 13 with respect to light of wavelengths from 450 nm to 750 nm is preferably from 2 cm$^{-1}$ to 100 cm$^{-1}$.

Figure 2A:
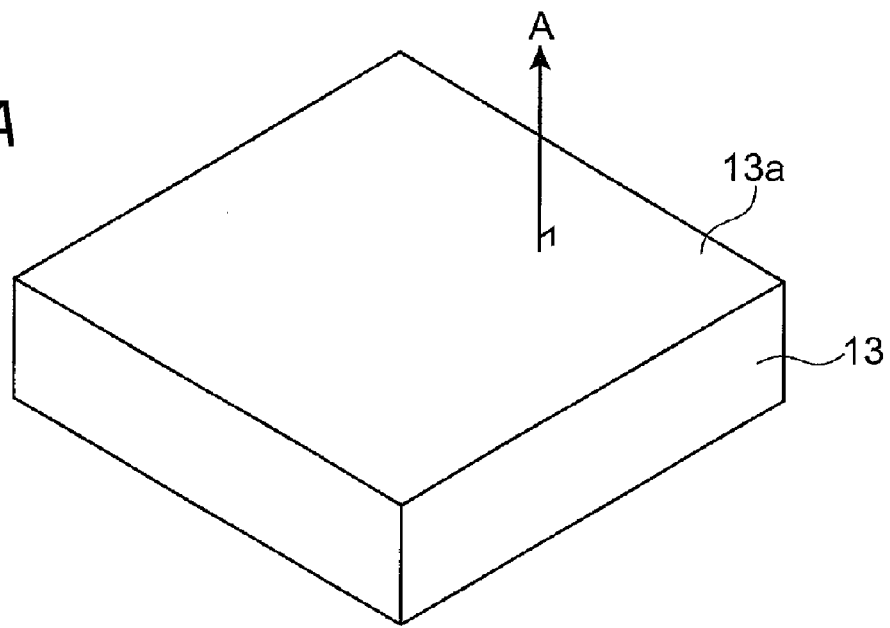
Figure 2B:
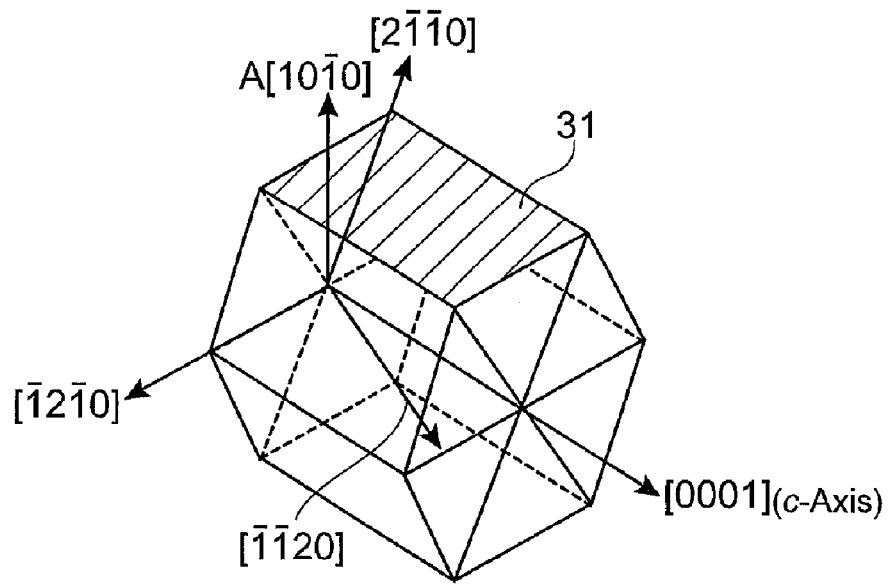
FIG. 2B is a diagram for explaining crystal orientation in the substrate depicted in FIG. 2A.

To illustrate, FIG. 2A is an isometric view depicting the substrate 13 in the present embodiment, and FIG. 2B is a diagram for explaining crystal orientation in the substrate 13 as depicted in FIG. 2A. The principal face 13a of the substrate 13 in the present embodiment is fashioned so that the angle formed by an axis A perpendicular to at least a portion of the principal face 13a, and a direction, in terms of the unit cells of the substrate 13 lattice, along the c-axis (that is, a <0001> direction) will be greater than zero. In particular, the principal face 13a preferably is formed so that, as illustrated in FIG. 2B, the axis A runs in a <10$\overline{1}$0> direction in substrate 13 unit cells. Put in different terms, at least a portion of the principal face 13a of the substrate 13 preferably contains a $\{10\overline{1}0\}$ plane (plane 31 in FIG. 2B) in substrate 13 unit cells. It should be understood that as stated herein, "contains a $\{10\overline{1}0\}$ plane" is not limited to implementations in which at least a portion of the principal face 13a coincides strictly with a $\{10\overline{1}0\}$ plane; for example, as long as the absolute value of the angle formed by a $\{10\overline{1}0\}$ plane and at least a portion of the principal face 13a is 10° or less, operational performance nearly equal to that of an implementation in which at least a portion of the principal face 13a coincides exactly with a $\{10\overline{1}0\}$ plane can be achieved.

Alternatively, the principal face 13a preferably is fashioned so that the axis A runs in a <11$\overline{2}$4> direction or a <11$\overline{2}$0> direction in terms of the unit cells of the substrate 13 lattice. Put in different terms, at least a portion of the principal face 13a of the substrate 13 preferably contains a $\{11\overline{2}4\}$ plane or a $\{11\overline{2}0\}$ plane in substrate 13 unit cells.

A further preference in the present embodiment is that the lattice constant of the substrate 13 along the c-axis (i.e., in the [0001] direction) be within a 5.1851±0.0005 Å range, with the constant on the $a_1$ axis ([2$\overline{1}\overline{1}$0] direction) or on the $a_2$ axis ([$\overline{1}$2$\overline{1}$0] direction) or on the $a_3$ axis ([$\overline{1}\overline{1}$20] direction) being within a 3.1891±0.0005 Å range. Alternatively, it is preferable that the full width at half maximum (FWHM) of an X-ray rocking curve measuring, by X-ray diffraction analysis, a unit surface area (1 mm×1 mm) in the principal face 13a of the substrate 13 be 1000 arcseconds or less. A substrate 13 furnishing any of the distinguishing features described above may be termed a substrate 13 of excellent crystalline properties. Such a substrate 13, moreover, is optimally realized by a manufacturing method to be described later.

A further preference is that in implementations in which the substrate 13 is a nitride substrate composed of a Group III nitride, the dislocation density in the principal face 13a of the substrate 13 be a comparatively small value, such as $1\times10^8$ cm$^{-2}$. Again, such a substrate 13 is optimally realized by a manufacturing method to be described later. Holding the dislocation density in the principal face 13a of the substrate 13 down relatively low allows the density of "pipe" dislocations that form in the active layer 5 and act as nonradiative centers to be reduced.

The n-type buffer layer 15 is constituted to include the same material as does the substrate 13, namely, a hexagonal compound such as a III-V compound containing Group III atoms and Group V atoms or a II-VI compound containing Group II atoms and Group VI atoms, to which has been added an n-type dopant such as Si.

Reference is again made to FIG. 1. The n-type cladding layer 3 is in the present embodiment a semiconductor layer of a first conductivity type, and is constituted to include a hexagonal crystalline semiconductor compound such as a III-V compound containing Group III atoms and Group V atoms, or a II-VI compound containing Group II atoms and Group VI atoms. Specifically, the n-type cladding layer 3 may be a first-conductivity-type nitride semiconductor layer composed of, for example, a Group III nitride containing nitrogen atoms (N) as Group V atoms (e.g., a GaN-based compound such as $Al_{x1}Ga_{1-x1}N$ ($0 \leq x_1 \leq 1$)), or may be a semiconductor layer composed of a compound containing zinc atoms (Zn) as Group II atoms (e.g., A ZnO-based compound such as $Mg_{y1}Zn_{1-y1}O$ ($0 \leq y_1 < 1$)). An n-type dopant such as silicon, for example, is added to the n-type cladding layer 3. The n-type cladding layer 3 is grown epitaxially onto the support base 11, that is, onto the n-type buffer layer 15.

The active layer 5 is the light-emitting region in the semiconductor light-emitting device 1. The active layer 5 is constituted to include a hexagonal compound such as a III-V compound containing Group III atoms and Group V atoms, or a II-VI compound containing Group II atoms and Group VI atoms. Specifically, active layer 5 is composed of, for example, a Group III nitride containing nitrogen atoms (N) as Group V atoms (e.g., a GaN-based compound such as $Al_xIn_yGa_{(1-x-y)}N$ ($0 \leq x \leq 1$, $0 < y \leq 1$)), or is composed of a compound containing zinc atoms (Zn) as Group II atoms (e.g., a ZnO-based compound such as ZnO for example). The active layer 5 is grown epitaxially onto the n-type cladding layer 3.

The p-type cladding layer 7 and the p-type contact layer 17 are in the present embodiment semiconductor layer of a second conductivity type, and are constituted to include a hexagonal crystalline semiconductor compound such as a III-V compound containing Group III atoms and Group V atoms, or a II-VI compound containing Group II atoms and Group VI atoms. Specifically, the p-type cladding layer 7 may be a second-conductivity-type nitride semiconductor layer composed of, for example, a Group III nitride containing nitrogen atoms (N) as Group V atoms (e.g., a GaN-based compound such as $Al_{x2}Ga_{1-x2}N$ ($0 \leq x_2 \leq 1$)), or may be a semiconductor layer composed of a compound containing zinc atoms (Zn) as Group II atoms (e.g., a ZnO-based compound such as $Mg_{y2}Zn_{1-y2}O$ ($0 \leq y_2 < 1$)). In implementations in which the p-type cladding layer 7 contains a III-V compound, magnesium (Mg), for example, is added as a p-type dopant to the p-type cladding layer 7. Likewise, in implementations in which the p-type cladding layer 7 contains a II-VI compound, nitrogen (N), for example, is added as a p-type dopant to the p-type cladding layer 7. The p-type cladding layer 7 is grown epitaxially onto the active layer 5. This means that the active layer 5 is sandwiched between the n-type cladding layer 3 and the p-type cladding layer 7.

The n-type cladding layer 3 supplies electrons to the active layer 5, while the p-type cladding layer 7 supplies holes to the active layer 5. Further, by the active layer 5 containing AlInGaN or ZnO, and the n-type cladding layer 3 and the p-type cladding layer 7 each being composed of AlGaN or MgZnO, the potential barrier (band gap) of the n-type cladding layer 3 and the p-type cladding layer 7 is made higher than the potential barrier of the active layer 5. Accordingly, the carriers (electrons and holes) supplied to the active layer 5 are confined to the interior of the active layer 5 by the action of the n-type cladding layer 3 and p-type cladding layer 7, which promotes their recombination in the active layer 5 for more efficient generation of light.

In this embodiment, inasmuch as the n-type buffer layer 15, the n-type cladding layer 3, the active layer 5, and the p-type cladding layer 7 are in order each grown epitaxially onto the principal face 13a of the substrate 13, the planar orientation of the boundary surface of the active layer 5 on its n-type cladding layer 3 side, and of the boundary surface of the active layer 5 on its p-type cladding layer 7 side each reflect the planar orientation of the principal face 13a. This means that the angle that an axis perpendicular to the active layer 5 interface with the n-type cladding layer 3, and the angle that an axis perpendicular to the active layer 5 interface with the p-type cladding layer 7 each form with the course of the c-axis in the active layer 5 will be greater than zero. For example, if at least a portion of the principal face 13a contains a $\{10\bar{1}0\}$ plane, the two interfaces flanking the active layer 5 will also contain a $\{10\bar{1}0\}$ plane. Here it is preferable that the two interfaces flanking the active layer 5 contain, as does the principal face 13a, any plane among the $\{10\bar{1}0\}$ planes, $\{11\bar{2}4\}$ planes and $\{11\bar{2}0\}$ planes in the active layer 5.

The p-type contact layer 17, a layer for electrically connecting the p-type cladding layer 7 and the anode 23, is composed of a hexagonal crystalline semiconductor compound to which a p-type dopant has been added. For example, in the present embodiment the p-type contact layer 17 is composed of a nitride semiconductor, such as gallium nitride, that has been doped with magnesium, or of a ZnO-based semiconductor compound, such as zinc oxide, that has been doped with nitrogen. The p-type contact layer is formed onto the p-type cladding layer 7.

The cathode 21 is in the present embodiment a first electrode. The cathode 21 is provided on the reverse face 13b of the substrate 13, and in the present embodiment the cathode 21 is provided on a single portion (the approximate central portion) of the substrate 13 reverse face 13b. The cathode 21 is a laminate of a sequence of metals, such as Ti—Al—Au for example, and therein realizes an ohmic contact between it and the reverse face 13b of the substrate 13.

The anode 23 is in the present embodiment a second electrode. The anode 23 is provided atop the p-type contact layer 17, and in the present embodiment the anode 23 is provided over the entire face of the p-type contact layer 17. The anode 23 is a laminate of a sequence of metals, such as Ni—Au—Al—Au for example, and therein realizes an ohmic contact between it and the p-type contact layer 17. In addition, the anode 23 functions to reflect light generated in the active layer 5.

Figure 3:
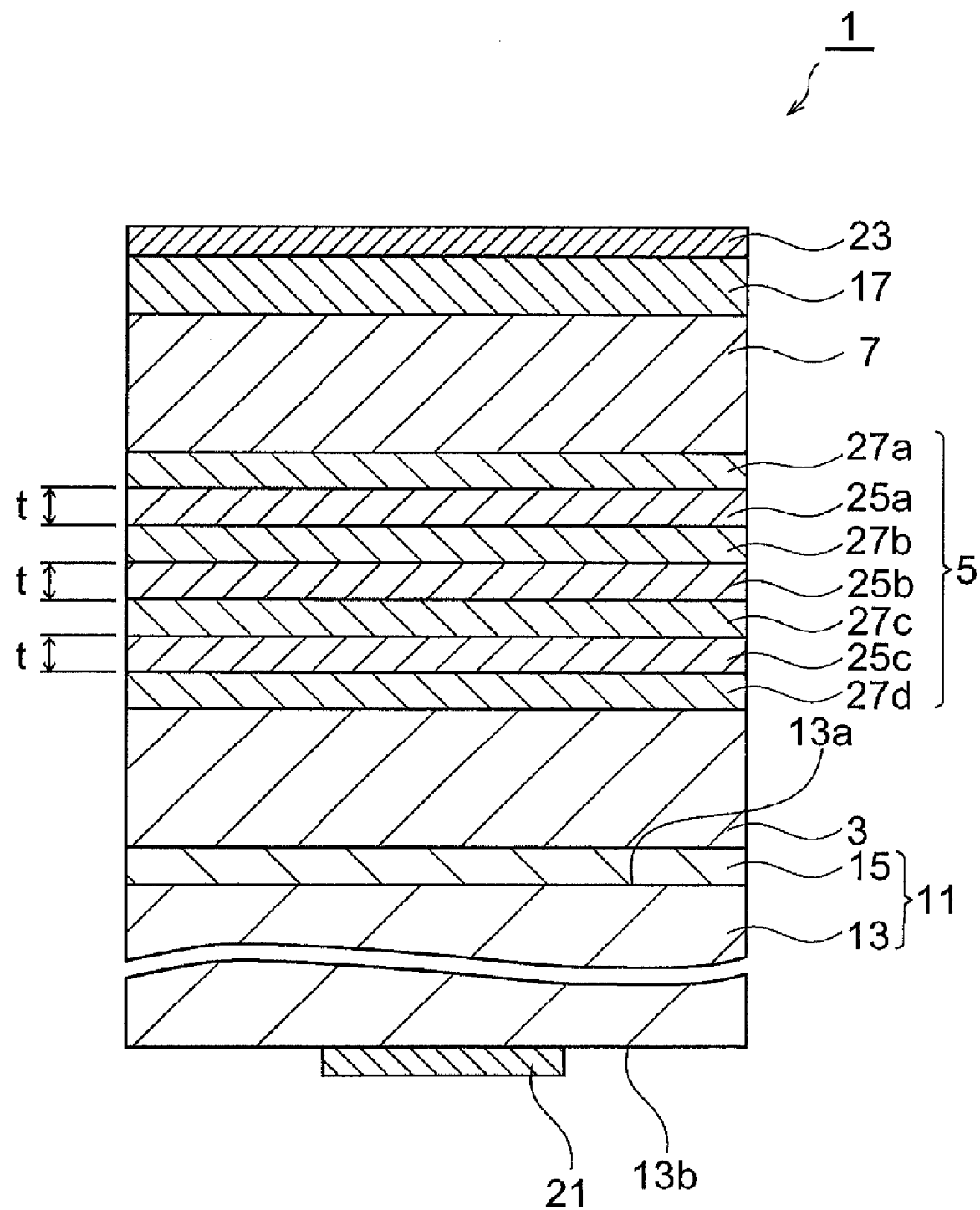
FIG. 3 is a sectional view of the semiconductor light-emitting device from a lateral perspective, for explaining in further detail an active layer in this embodiment.

In that regard, in order to give further details of the active layer 5 in the present embodiment, the description now turns to FIG. 3, a lateral sectional view of the semiconductor light-emitting device 1. The active layer 5 includes one or a plurality of well layers (for example, well layers 25a–25c) and a plurality of barrier layers (for example, barrier layers 27a–27d), as depicted in FIG. 3. In the present embodiment, the well layers 25a through 25c are formed so that the thickness of each of the well layers 25a–25c will be greater than 3 nm.

The well layers 25a–25c are laminated in alternation with the barrier layers 27a–27d, thus constituting a quantum-well structure in the active layer 5. In an implementation in which the active layer 5 is composed of a Group III nitride, the well layers 25a–25c are exemplarily composed of $Al_xIn_yGa_{(1-x-y)}N$ ($0 \leq x \leq 1$, $0 < y \leq 1$), and the barrier layers 27a–27d are exemplarily composed of $Al_{x3}In_{y3}Ga_{(1-x3-y3)}N$ ($0 \leq x_3 \leq 1$, $0 \leq y_3 < 1$). The quantum-well structure is constituted so that the band gap of the barrier layers 27a–27d will be larger than the band gap of the well layers 25a–25c, and accordingly the barrier layers 27a–27d set up a potential barrier in the well layers 25a–25c. It should be understood that although the active layer 5 in the present embodiment has a multiplequantum-well (MQW) structure, it may instead have a single-quantum-well (SQW) structure.

A further feature of the active layer 5 is that because the well layers 25a–25c and the barrier layers 27a–27d respectively are epitaxially grown by turns, the planar orientations of the interfaces between the well layers 25a–25c and the barrier layers 27a–27d each reflect the planar orientation of the principal face 13a of the substrate 13. This means that the angle that an axis perpendicular to the interfaces between the well layers 25a–25c and the barrier layers 27a–27d forms with the course of the c-axes in the well layers 25a–25c and the barrier layers 27a–27d will be greater than zero. It is preferable that the interfaces between the well layers 25a–25c and the barrier layers 27a–27d contain, as does the principal face 13a, any plane among the $\{10\bar{1}0\}$ planes, $\{11\bar{2}4\}$ planes and $\{11\bar{2}0\}$ planes.

Herein, in order to achieve comparatively intense brightness with the semiconductor light-emitting device 1 the surface area of a sectional plane intersecting the course of the active layer 5 thickness preferably is 0.1 mm$^2$ or more. And in order to maintain highly efficient emission of light, within the just-noted sectional surface area in the active layer 5, the surface-area proportion into which carriers are implanted to make that proportion a light-emitting region is preferably 90% or more.

The operation of a semiconductor light-emitting device 1 having the foregoing configuration is as follows. A drive voltage is applied across the anode 23 and the cathode 21, whereupon electrons and holes concentrate in the well layers 25a–25c inside the active layer 5. Then, by the electrons and holes recombining within the well layers 25a–25c, light is produced. Among the light generated in the active layer 5, rays directed toward the anode 23 are reflected at the anode 23, and the light is then output to the exterior of the semiconductor light-emitting device through the reverse face 13b of the substrate 13.

Figure 4A:
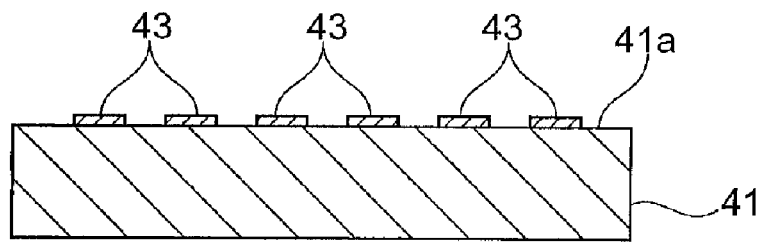
FIGS. 4A–4C are sectional views for explaining a method of manufacturing a substrate for this embodiment.
Figure 4B:
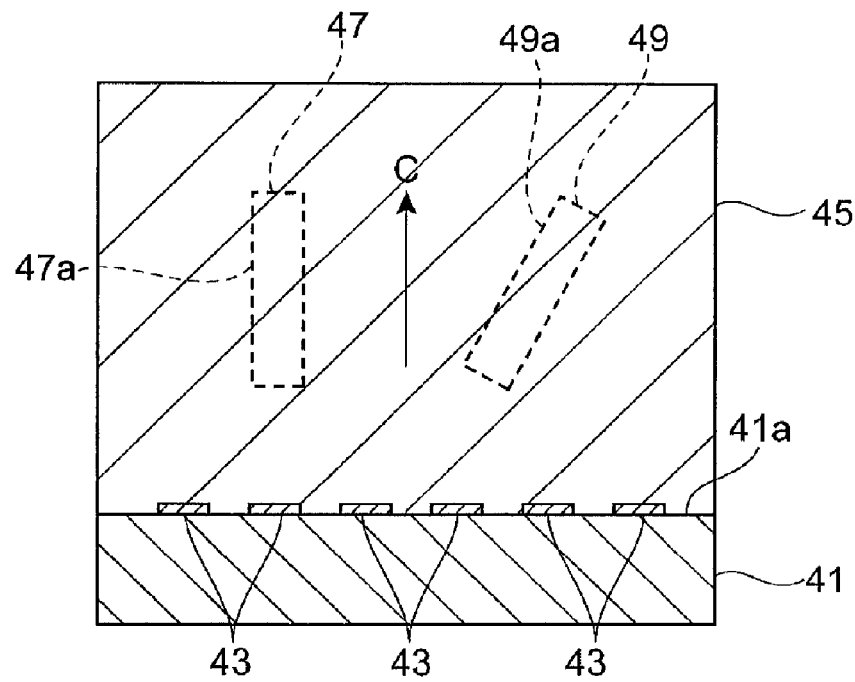
Figure 4C:
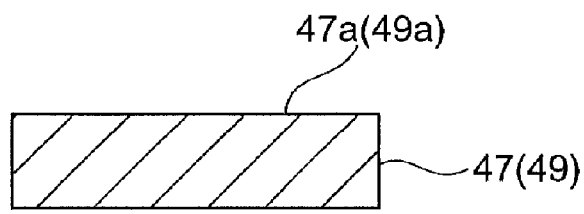

At this point, a method of manufacturing a semiconductor light-emitting device 1 of the present embodiment as described in the foregoing will be explained. Reference is made to FIGS. 4A–4C, sectional views for explaining a method of manufacturing a substrate 13 (cf. FIG. 2A) of the present embodiment, and to FIGS. 5A–5C, sectional views for explaining a method of manufacturing a semiconductor light-emitting device 1 utilizing the substrate 13. It should be understood that although an implementation in which the substrate 13 is composed of gallium nitride (GaN) will be detailed in the description below, implementations in which the substrate 13 is composed of aluminum nitride (AlN) are also manufacturable by the same method as below.

At first, a GaAs wafer 41 with its principal face 41a being a $\{111\}$ plane, as is represented in FIG. 4A, is readied. Then, by a technique, which will be explained below, called epitaxial lateral overgrowth (ELO), GaN is grown onto the principal face 41a of the GaAs wafer. In the ELO, initially a mask 43 having windows is formed on the principal face 41a of the GaAs wafer 41. A substance on which GaN will not directly grow should be utilized as the material for the window-perforated mask 43.

The manufacturing method continues by epitaxially growing GaN on the principal face 41a of the GaAs wafer 41, through the windows in the perforated mask 43, whereby a GaN ingot 45 is formed. The GaN grows along the c-axis in the process. And although crystal defects (dislocations, etc.) originating in lattice mismatch between GaAs and GaN are produced in the process, because the GaN after growing directly over the GaAs wafer 41 grows on the perforated mask 43, in a direction paralleling the principal face 41a, the crystal defects also grow in the same direction. The crystal defects then gather in locations in which neighboring instances of GaN having grown in the direction paralleling the principal face 41a collide, becoming planar defects. The fact that crystal defects that arise scattered in the GaN interior are in this way concentrated into planar defects by ELO contributes to optimally obtaining a GaN ingot 45 of low dislocation density, in which the dislocation density might be 1×10$^8$ cm$^{-2}$, for example.

The method then proceeds by cutting GaN wafers 47 off of the GaN ingot 45. In the process slicing so that for example the principal face 47a of the GaN wafers 47 will be parallel to the course of the c-axis in the GaN ingot enables GaN wafers 47 that contain a $\{10\bar{1}0\}$ plane or a $\{11\bar{2}0\}$ plane in the principal face 47a to be optimally obtained (FIG. 4C). Alternatively, slicing so that for example the principal face 49a of GaN wafers 49 diagonally intersects the course of the c-axis in the GaN ingot 45 enables GaN wafers 49 that contain a $\{11\bar{2}4\}$ plane in the principal face 49a to be optimally obtained. Here, in the description below, the situation in which GaN wafers 47 containing a $\{10\bar{1}0\}$ plane in the principal face 47a are sliced off the ingot will be detailed.

The method then continues by epitaxially growing, as shown in FIG. 5A, an n-type buffer layer 51, an n-type cladding layer 53, an active layer 55, a p-type cladding layer 57, and a p-type contact layer 59 in order onto the principal face 47a of the GaN wafer 47. These layers are of the same materials as the previously described materials of the n-type buffer layer 15, the n-type cladding layer 3, the active layer 5, the p-type cladding layer 7, and the p-type contact layer 17, respectively. This epitaxial growth is followed by the formation of an anode 61, as shown in FIG. 5B, onto the p-type contact layer 59 by a process such as vapor deposition. In turn, a mask of a predetermined pattern is wrought onto the reverse face 47b of the GaN wafer 47, where a plurality of cathodes 21 is formed by vapor-deposition of a cathode material and subsequent removal of the mask.

In the next stage, the GaN wafer 47 and the overlying layers are cleaved through their thickness to complete a semiconductor light-emitting device 1 furnished with a substrate 13 made of GaN, an n-type buffer layer 15, an n-type cladding layer 3, an active layer 5, a p-type cladding layer 7, a p-type contact layer 17, an anode 23, and a cathode 21.

In implementations in which the substrate 13 is composed of zinc oxide (ZnO), although the way that the ingot is grown will differ from that when the substrate is composed of gallium nitride, a semiconductor light-emitting device 1 may be manufactured by a method that is the same as the foregoing manufacturing method from the stage in which wafers are sliced from the ingot. In such implementations, initially zinc oxide (ZnO) wafers are sliced from electroconductive ZnO crystal. In the process of doing so, slicing so that for example the principal face of the ZnO wafer will be parallel to the course of the c-axis in the ZnO crystal enables ZnO wafers that contain a $\{10\bar{1}0\}$ plane or a $\{11\bar{2}0\}$ plane in the principal face to be obtained. Alternatively, slicing so that for example the principal face of the ZnO wafers diagonally intersects the course of the c-axis in the ZnO crystal enables ZnO wafers that contain a $\{11\bar{2}4\}$ plane in the principal face to be obtained.

In this implementation, the method then continues by utilizing molecular-beam epitaxy to grow in order an n-type buffer layer composed of n-type ZnO, and an n-type cladding layer composed of n-type MgZnO, each at a thickness of from 10 nm to 1000 nm, onto the ZnO wafer, thereon to grow an active layer composed of undoped ZnO, at a thickness of from 1 nm to 10 nm, and thereon to grow in order a p-type buffer layer composed of p-type MgZnO, and a p-type contact layer composed of ZnO, each at a thickness of from 10 nm to 1000 nm. Ohmic electrodes are then formed respectively on the reverse face of the ZnO wafer, and on the p-type contact layer, and the ZnO wafer and the layers on the ZnO wafer are cleaved through their thickness to complete a semiconductor light-emitting device.

Performance of a semiconductor light-emitting device 1 according to the present embodiment as described in the foregoing will be explained. Ordinarily in manufacturing a Group-III nitride semiconductor or a ZnO-based semiconductor, in most cases the semiconductor layers such as the active layer are grown onto the c-face of the substrate. This is because for the crystal-surface planarity and the device photoluminescence characteristics, growing Group III nitrides or ZnO-based compounds along the c-axis is preferable.

Nevertheless, in instances in which an axis orthogonal to the two interfaces (heterointerfaces) flanking the active layer and the c-axis in the active layer coincide (that is, in instances in which the active layer has been grown onto the c-plane), spontaneous electric fields, such as piezoelectric fields, produced in the heterointerfaces of the active layer become maximal. In a semiconductor light-emitting device 1 according to the present embodiment, the active layer 5 is formed so that the angle that an axis orthogonal to the interface of the active layer 5 with the n-type cladding layer 3, and the angle that an axis orthogonal to the interface of the active layer 5 with the p-type cladding layer 7 each make with the c-axis in the active layer 5 will be greater than zero (that is, so that the two heterointerfaces flanking the active layer 5 will not be c-planes). This contributes to reducing spontaneous electric fields occurring in the active layer 5. The fact the overlapping portions of the wave functions of the electrons and holes in the active layer 5 are thus broadened, raising the likelihood that the electrons and holes will recombine, paves the way to making the active layer 5 thicker than what has been conventional, which enables the brightness of the light-emitting device to be enhanced.

A further feature of a semiconductor light-emitting device 1 according to the present embodiment is that the principal face 13a of the substrate 13 is fashioned so that the angle formed by an axis A (cf. FIGS. 2A and 2B) orthogonal to the principal face 13a, and the c-axis of the substrate 13 will be larger than zero (that is, so that the principal face 13a of the substrate 13 will not be a c-plane). Consequently, the fact that the two heterointerfaces of the active layer 5 grown epitaxially onto the principal face 13a will not be c-planes makes possible the reduction of spontaneous electric fields occurring in the active layer 5. This also enables the active layer 5 to be made thicker than usual, which provides for enhancing the brightness of the semiconductor light-emitting device.

What is more, the present inventors discovered that with II-VI compounds, crystals grown in a direction other than the c-axis direction yielded better semiconductor characteristics than II-VI crystals grown with the course of the c-axis as the growth direction. In this regard, reference is made to FIG. 6, which is a chart setting forth residual electron densities within MgZnO not having been doped, and p-type carrier concentration within MgZnO having been nitrogen-doped, in cases in which MgZnO crystal was grown onto a $\{0001\}$ plane, onto a $\{10\bar{1}0\}$ plane, and onto a $\{11\bar{2}4\}$ plane, respectively. From FIG. 6 it will be understood that in the instance in which MgZnO crystal was grown onto a $\{0001\}$ plane (that is, in an instance in which ZnO crystal was grown with the course of the c-axis as the growth direction), with the MgZnO not having been doped the residual electron density was a large $5\times10^{16}$ cm$^{-3}$, moreover, with the MgZnO having been nitrogen-doped the p-type carrier concentration was unmeasurable, meaning that the crystal did not exhibit p-type conductivity. In contrast, in the instance in which MgZnO crystal was grown onto a $\{10\bar{1}0\}$ plane, with the MgZnO not having been doped the residual electron density became a small $8\times10^{14}$ cm$^{-3}$, and with the MgZnO having been nitrogen-doped the p-type carrier concentration was detectable to a large value, being in this case $5\times10^{17}$ cm$^{-3}$. Likewise, in the instance in which MgZnO crystal was grown onto a $\{11\bar{2}4\}$ plane, with the MgZnO not having been doped the residual electron density became a small $2\times10^{15}$ cm$^{-3}$, and with the MgZnO having been nitrogen-doped the p-type carrier concentration was detectable to a large value, being in this case $3\times10^{17}$ cm$^{-3}$.

In this way growing MgZnO crystal with the growth direction being a course tilted from the c-axis allows a desired impurity concentration to be realized and yields excellent semiconductor characteristics. This is presumably because in the instance in which MgZnO crystal is grown with the course of growth being directed along the c-axis, the balance between the zinc (Zn) and oxygen (O) in the crystal interior is easily disturbed, producing many defects in the crystal and destabilizing it electrically. Yet by means of a semiconductor light-emitting device 1 of the present embodiment, because the principal face 13a of the substrate 13 is fashioned so that the angle formed by an axis orthogonal to the principal face 13a, and the course of c-axis of the substrate 13 will be larger than zero, the impurity concentration of p-type semiconductor layers (the p-type cladding layer 7 and the p-type contact layer 17) that are grown on the principal face 13a can be readily controlled to a desired value. It should be noted that by mixing cadmium atoms (Cd) into the MgZnO crystal, the crystalline properties of the MgZnO crystal can be further improved.

It is further preferable that, as in the present embodiment, the principal face 13a of the substrate 13 contain any one plane among the $\{10\bar{1}0\}$ planes, $\{11\bar{2}4\}$ planes, and $\{11\bar{2}0\}$ planes of the substrate 13. This will mean that the two heterointerfaces on the active layer 5 will contain the any one plane among these planes, which contributes to the effective reduction of spontaneous electric fields occurring in the active layer 5.

An additional preference is that, as in the present embodiment, a cathode 21 be provided on the reverse face 13b of the substrate 13, and an anode 23 be provided on the p-type contact layer 17. In this way providing electrodes on the two faces of the semiconductor light-emitting device 1 enables electrons and holes to be implanted efficiently into the active layer 5 to make for brightness-enhancing the semiconductor light-emitting device further.

It is also preferable that, as in the present embodiment, dislocation density in the principal face 13a of the substrate 13 be $1\times10^8$ cm$^{-2}$ or less. By the dislocation density in the principal face 13a of the substrate 13 in this way being comparatively small, the density of dislocations that, penetrating the n-type buffer layer 15 and the n-type cladding layer 3, reach the active layer 5 can be held low, which makes further heightening of the device's light-emitting efficiency possible.

Yet a further preference in the present invention is that, as in the present embodiment, the active layer 5 has a quantum-well structure that includes well layers 25a–25c and, flanking the well layers 25a–25c and setting up a potential barrier in the well layers 25a–25c, barrier layers 27a–27d, with the thickness of the well layers 25a–25c being greater than 3 nm. Traditionally in a quantum-well structure, on account of spontaneous electric fields arising in the heterointerfaces on the active layer, the well-layer thickness has been restricted to being no greater than 3 nm. But by means of a semiconductor light-emitting device 1 according to the present embodiment, spontaneous electric fields in the well layers 25a–25c as described above can be reduced, enabling the well layers 25a–25c to be made thicker than usual (thicker than 3 nm).

Furthermore, as is the case in the present embodiment, the well layers 25a–25c may be composed of $Al_xIn_yGa_{(1-x-y)}N$ ($0 \leq x \leq 1$, $0 < y \leq 1$). In an implementation in which the well layers 25a–25c include indium (In) in their composition, although the larger the atomic fraction of In, the more pronounced will be the occurrences of spontaneous electric fields, in a semiconductor light-emitting device 1 according to the present invention, because spontaneous electric fields in the well layers 25a–25c can be reduced, enhanced brightness is yet made possible in implementations in which the well layers 25a–25c include indium (In) in their composition.

In addition, as is the case in the present embodiment the hexagonal compound constituting the n-type cladding layer 3, the active layer 5, and the p-type cladding layer 7 may contain Group II atoms and Group VI atoms, or it may contain Group III atoms and Group V atoms. Inasmuch as II-VI crystalline compounds containing Group II atoms and Group VI atoms, and III-V crystalline compounds containing Group III atoms and Group V atoms each constitute hexagonal crystals, the angle that an axis perpendicular to the active layer 5 interface with the n-type cladding layer 3, and the angle that an axis perpendicular to the active layer 5 interface with the p-type cladding layer 7 each form with the c-axis in the active layer 5 will be greater than zero, which enables the efficient reduction of spontaneous electric fields in the active layer 5.

Semiconductor light-emitting devices in accordance with the present invention are not limited to the embodiment described above, in that various modifications are possible besides. For example, although planar-emitting semiconductor devices, such as a light-emitting diodes, as the semiconductor light-emitting devices have been described in the foregoing embodiment, the present invention is applicable to laser diodes as well.

What is claimed is:

1. A semiconductor light-emitting device comprising:
a semiconductor layer of a first conductivity type, composed of a hexagonal compound;
a semiconductor layer of a second conductivity type, composed of a hexagonal compound and provided over said first-conductivity-type semiconductor layer; and
an active layer, composed of a hexagonal compound and provided in between, defining interfaces respectively with, said first-conductivity-type semiconductor layer and said second-conductivity-type semiconductor layer; wherein
said layers are formed so that the angle that an axis orthogonal to the active-layer interface with said first-conductivity-type semiconductor layer, and the angle that an axis orthogonal to the active-layer interface with said second-conductivity-type semiconductor layer each form with the c-axis defined by the unit cell of the hexagonal compound forming said active layer are greater than zero.

2. A semiconductor light-emitting device as set forth in claim 1, wherein the hexagonal compounds of said first-conductivity-type semiconductor layer, said second-conductivity-type semiconductor layer, and said active layer include Group II atoms and Group VI atoms.

3. A semiconductor light-emitting device as set forth in claim 2, wherein the Group II atoms are zinc atoms.

4. A semiconductor light-emitting device as set forth in claim 2, wherein the hexegonal compounds are ZnO-based compounds.

5. A semiconductor light-emitting device as set forth in claim 1, wherein the hexagonal compounds of said first-conductivity-type semiconductor layer, said second-conductivity-type semiconductor layer, and said active layer include Group III atoms and Group V atoms.

6. A semiconductor light-emitting device as set forth in claim 5, wherein the Group V atoms are nitrogen atoms.

7. A semiconductor light-emitting device as set forth in claim 5, wherein the hexagonal compounds are GaN-based compounds.

8. A semiconductor light-emitting device comprising:
a substrate composed of a hexagonal compound and having a principal face;
a semiconductor layer of a first conductivity type, composed of a hexagonal compound and grown epitaxially onto said principal face of said substrate;
an active layer grown epitaxially onto said first-conductivity-type semiconductor layer and composed of a hexagonal compound; and
a semiconductor layer of a second conductivity type, composed of a hexagonal compound and grown epitaxially onto said active layer; wherein
said substrate is formed so that the angle that an axis orthogonal to said principal face of said substrate forms with the c-axis defined by the unit cell of the hexagonal compound forming said substrate is greater than zero.

9. A semiconductor light-emitting device as set forth in claim 8, wherein the principal face of said substrate contains any one plane among the $\{10\bar{1}0\}$ planes, $\{11\bar{2}4\}$ planes, and $\{11\bar{2}0\}$ planes of said substrate.

10. A semiconductor light-emitting device as set forth in claim 2, further comprising:
a first electrode, provided on the reverse face of said substrate and in ohmic contact with said substrate; and
a second electrode, provided on said second-conductivity-type semiconductor layer and in ohmic contact with said second-conductivity-type semiconductor layer.

11. A semiconductor light-emitting device as set forth in claim 8, wherein the hexagonal compounds of said first-conductivity-type semiconductor layer, said second-conductivity-type semiconductor layer, and said active layer include Group II atoms and Group VI atoms.

12. A semiconductor light-emitting device as set forth in claim 11, wherein the Group II atoms are zinc atoms.

13. A semiconductor light-emitting device as set forth in claim 11, wherein the hexagonal compounds are ZnO-based compounds.

14. A semiconductor light-emitting device as set forth in claim 8, wherein the hexagonal compounds of said first-conductivity-type semiconductor layer, said second-conductivity-type semiconductor layer, and said active layer include Group III atoms and Group V atoms.

15. A semiconductor light-emitting device as set forth in claim 14, wherein the Group V atoms are nitrogen atoms.

16. A semiconductor light-emitting device as set forth in claim 14, wherein the hexagonal compounds are GaN-based compounds.

17. A semiconductor light-emitting device comprising:

a nitride semiconductor layer of a first conductivity type;

a nitride semiconductor layer of a second conductivity type, provided over said first-conductivity-type nitride semiconductor layer; and an active layer provided in between, defining interfaces respectively with, said first-conductivity-type nitride semiconductor layer and said second-conductivity-type nitride semiconductor layer, and composed of a nitride; wherein said layers are formed so that the angle that an axis orthogonal to the active-layer interface with said first-conductivity-type nitride semiconductor layer, and the angle that an axis orthogonal to the active-layer interface with said second-conductivity-type nitride semiconductor layer each form with the c-axis defined by the unit cell of the hexagonal compound forming the active layer are greater than zero.

18. A semiconductor light-emitting device as set forth in claim 17, wherein said active layer is lent a quantum-well structure including:

a well layer of greater than 3 nm thickness; and barrier layers flanking the well layer and setting up a potential barrier in the well layer.

19. A semiconductor light-emitting device as set forth in claim 18, wherein the well layer is composed of $Al_xIn_yGa_{(1-x-y)}N$ ($0 \leq x \leq 1$, $0 < y \leq 1$).

20. A semiconductor light-emitting device comprising:

a substrate composed of a Group III nitride and having a principal face;

a nitride semiconductor layer of a first conductivity type, grown epitaxially onto said principal face of said nitride substrate;

an active layer grown epitaxially onto said first-conductivity-type nitride semiconductor layer and composed of a nitride; and a nitride semiconductor layer of a second conductivity type, grown epitaxially onto said active layer; wherein said substrate is formed so that the angle that an axis orthogonal to said principal face of said nitride substrate forms with the c-axis defined by the unit cell of the hexagonal compound forming said nitride substrate is greater than zero.

21. A semiconductor light-emitting device as set forth in claim 20, wherein the principal face of said nitride substrate contains any one plane among the $\{10\bar{1}0\}$ planes, $\{11\bar{2}4\}$ planes, and $\{11\bar{2}0\}$ planes of said nitride substrate.

22. A semiconductor light-emitting device as set forth in claim 20, further comprising:

a first electrode, provided on the reverse face of said nitride substrate and in ohmic contact with said nitride substrate; and a second electrode, provided on said second-conductivity-type semiconductor layer and in ohmic contact with said second-conductivity-type semiconductor layer.

23. A semiconductor light-emitting device as set forth in claim 20, wherein dislocation density in said principal face of said nitride substrate is $1 \times 10^8$ cm$^{-2}$ or less.

24. A semiconductor light-emitting device as set forth in claim 20, wherein said active layer is lent a quantum-well structure including:

a well layer of greater than 3 nm thickness; and barrier layers flanking the well layer and setting up a potential barrier in the well layer.

25. A semiconductor light-emitting device as set forth in claim 24, wherein the well layer is composed of $Al_xIn_yGa_{(1-x-y)}N$ ($0 \leq x \leq 1$, $0 < y \leq 1$).

* * * * *